United States Patent
Hagberg

[19]

[11] Patent Number: 5,948,046
[45] Date of Patent: Sep. 7, 1999

[54] MULTI-DIVIDE FREQUENCY DIVISION

[75] Inventor: Hans Hagberg, Lund, Sweden

[73] Assignee: Telefonaktiebolaget LM Ericsson, Stockholm, Sweden

[21] Appl. No.: 08/990,772

[22] Filed: Dec. 15, 1997

[51] Int. Cl.[6] .............................. G06F 7/52; H03K 21/00
[52] U.S. Cl. .............................................. 708/103; 377/47
[58] Field of Search ......................... 377/47–48; 708/103

[56] References Cited

U.S. PATENT DOCUMENTS

| | | | |
|---|---|---|---|
| 4,494,243 | 1/1985 | Elmis ...................................... | 364/703 |
| 4,669,099 | 5/1987 | Zinn ....................................... | 364/703 |
| 4,965,531 | 10/1990 | Riley . | |
| 5,055,802 | 10/1991 | Hietala et al. . | |
| 5,065,415 | 11/1991 | Yamashita . | |
| 5,172,400 | 12/1992 | Maemura ................................ | 377/47 |
| 5,349,622 | 9/1994 | Gorisse . | |

FOREIGN PATENT DOCUMENTS

| | | |
|---|---|---|
| 0682411A1 | 11/1995 | European Pat. Off. . |
| 2666707 | 3/1992 | France . |

OTHER PUBLICATIONS

Thomas A.D. Riley, et al., "A Simplified Continuous Phase Modulator Technique", IEEE Transactions on Circuits and Systems–II: Analog and Digital Signal Processing, vol. 41, No. 5, May 1994, pp. 321–327.

Tom A.D. Riley, et al., "Delta–Sigma Modulation in Fractional–N Frequency Synthesis", IEEE Journal of Solid–State Circuits, vol. 28, No. 5, May 1993, pp. 553–559.

Brian Miller, et al., "A Multiple Modulator Fractional Divider", Forty–Fourth Annual Symposium on Frequency Control, May 1990, pp. 559–568.

Brian Miller, et al., "A Multiple Modulator Fractional Divider", IEEE Transactions on Instrumentation and Measurement, vol. 40, No. 3, Jun. 1991, pp. 578–583.

*Primary Examiner*—Tan V. Mai
*Attorney, Agent, or Firm*—Burns, Doane, Swecker & Mathis, L.L.P.

[57] ABSTRACT

A multi-divide frequency divider, includes a chain of serially-connected frequency divider units, each responding to a first state of received control signals by using the reference clock signal to generate an output signal having a frequency that is the reference clock frequency divided by a first divisor, and each responding to a second state of the control signals by using the reference clock signal to generate an output signal having a frequency that is the reference clock frequency divided by a second divisor. The output signal may be supplied to a successor frequency divider unit in the chain. Division by the first and second divisors causes the frequency divider to respectively transition through first and second predetermined state sequences. Each frequency divider further responds to a third state of the control signals by initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals. Receipt of a received swallow enable control signal having a predetermined value disables division by the second divisor. Each frequency divider further generates an output control signal having the predetermined value whenever the frequency divider is in the initial state.

12 Claims, 13 Drawing Sheets

MULTI-DIVIDE FREQUENCY DIVISION

BACKGROUND

The present invention relates to frequency dividers, and more particularly, to frequency dividers capable of division by a plurality of divisors.

Multi-divide frequency dividers are useful in many applications. One such use is in a ΔΣ controlled factional-N phase-locked loop (PLL) modulator. This type of modulator is a cost and space efficient way of implementing continuous phase modulation (CPM). CPM is used to achieve spectrum efficient digital communication, such as in the GSM/DCS system. Although this modulation technique is particularly suitable for mobile stations in cellular communications systems, its application is not limited to them.

A prior art implementation of a continuous phase modulator is depicted in FIG. 1. The information to be transmitted 100 is supplied to a digital signal processor unit 101 that generates therefrom the in-phase (I) and quadrature (Q) components. These are supplied to respective digital-to-analog (D/A) converters 103a, 103b. The outputs of the D/A converters 103a, 103b are in turn supplied to respective low-pass filters 105a, 105b. The outputs from each of the low-pass filters 105a, 105b are supplied to first inputs of respective multipliers 107a, 107b. A first carrier signal 109a is supplied to a second input of the multiplier 107a in the in-phase path. A second carrier signal 109b, that is 90° out of phase with respect to the first carrier signal 109a, is supplied to a second input of the multiplier 107b in the out-of-phase path. The outputs of the multipliers 107a, 107b are then summed in an adder 111 to form the modulated signal 113 to be amplified and transmitted.

Recently, an alternative implementation of a continuous phase modulator was proposed by Riley and Copeland, "A simplified continuous phase modulator technique", *IEEE Transactions on Circuits and Systems-II: Analog and Digital Signal Processing,*" vol. 41, pp. 321–326, May 1994. In this alternative implementation, a ΔΣ modulator is employed to control the division factor of a fractional-N Phase-Locked Loop (PLL). Similar approaches are also described in T. A. Riley, M. A. Copeland and T. A. Kwasniewski, "Delta-sigma modulation in fractional-N frequency synthesis", *IEEE Transactions on Solid-State Circuits*, vol. 28, pp. 553–559, May 1993; B. Miller and B. Conley, "A multiple modulator fractional divider", *The 44th Annual Symposium on Frequency Control*, pp. 559–568, May 1990; B. Miller and B. Conley, "A multiple modulator fractional divider", *IEEE Transactions on Instrumentation and Measurement*, vol. 40, pp. 578–583, June 1991. W. H. Alexander and D. C. Rabe, *Multiaccumulator Sigma-Delta fractional-N Synthesis*. Reference is also made to U.S. Pat. No. 5,055,802, issued on Oct. 8, 1991 to W. H. Alexander and D. C. Rabe, entitled *Multiaccumulator Sigma-Delta fractional-N Synthesis*; and to U.S. Pat. No. 4,965,531, issued on Oct. 23, 1993 to T. Riley, entitled *Frequency Synthesizer*. ΔΣ controlled fractional-N PLL modulation is a cost and space efficient implementation that has many benefits. For example, it guarantees continuous phase. Furthermore, the modulation, as well as channel selection, can be controlled in a purely direct and digital manner. By using a multi-divide frequency divider (i.e., a frequency divider that is capable of dividing by a plurality of divisors) in the PLL, a ΔΣ controlled fractional-N PLL modulator could easily be used for a multi-band application.

A block diagram of a prior art ΔΣ controlled fractional-N PLL modulator is depicted in FIG. 2. A reference signal 201 is fed to a phase detector 202 together with the phase of the output of a frequency divider 206. The reference signal 201 is preferably a sinusoidal signal having a frequency denoted by $f_{ref}$. The output of the phase detector 202 is a pulse that is related to the phase difference between the reference signal 201 and the output of the frequency divider 206. The output of the phase detector 202 is fed to a charge pump 207 and then filtered by a loop filter 208. The output of the loop filter 208 is then applied to a voltage controlled oscillator (VCO) 209. The output signal of the VCO 209 is supplied to the input of the frequency divider 206. As a result of this feedback arrangement, the output frequency of the VCO 205 is driven to equal the frequency of the reference signal 201 times the division factor of the frequency divider 206. Hence, the frequency of the VCO 209 can be controlled by controlling the division factor of the frequency divider 206. In a ΔΣ controlled fractional-N PLL modulator, the division factors are generated by a ΔΣ modulator 210, whose input receives a modulating signal 211.

The frequency divider 206 in the PLL has to fulfill three important requirements in order to achieve the desired modulation. First, it must be able to change the division factor once every reference frequency cycle. Second, it must introduce exactly equal delay for all division factors, in order to avoid extra nonlinearities in the loop. Third, it must be able to accomplish a wide range of consecutive division factors in order to make the ΔΣ controlled fractional-N PLL modulator work at a wide range of radio frequencies, and thereby accomplish the multi-band functionality.

SUMMARY

It is therefore an object of the present invention to provide a frequency divider that is capable of responding to changes of the division factor once every reference frequency cycle.

It is a further object of the invention to provide a frequency divider that introduces exactly equal delay for all division factors It is still another object of the invention to provide a frequency divider that is capable of dividing by a wide range of consecutive division factors.

In accordance with one aspect of the present invention, the foregoing and other objects are achieved in a frequency divider that is selectively capable of dividing by first and second divisors greater than one. The frequency divider comprises means for receiving a reference clock signal having a reference clock frequency; means for receiving a plurality of control signals; and first means, responsive to a first state of the control signals, for using the reference clock signal to generate an output signal having a frequency that is the reference clock frequency divided by the first divisor, wherein division by the first divisor causes the frequency divider to transition through a first predetermined state sequence. The frequency divider further includes second means, responsive to a second state of the control signals, for using the reference clock signal to generate an output signal having a frequency that is the reference clock frequency divided by the second divisor, wherein division by the second divisor causes the frequency divider to transition through a second predetermined state sequence; and third means, responsive to a third state of the control signals, for initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals.

In another aspect of the invention, the first and second means are deactivated so long as the third state of the control signals continues to be received by the receiving means.

In yet another aspect of the invention, the frequency divider further comprises means for receiving a swallow enable control signal; means for disabling the second means whenever the swallow enable control signal is not set to a predetermined value; and means for generating an output control signal having the predetermined value whenever the frequency divider is in the initial state.

In still another aspect of the invention, the first divisor is two and the second divisor is three.

In yet another aspect of the invention, a multi-divide frequency divider is formed that includes a plurality of serially-connected frequency divider units, each comprising means for receiving a reference clock signal having a reference clock frequency; means for receiving a plurality of control signals; first means, responsive to a first state of the control signals, for using the reference clock signal to generate an output signal having a frequency that is the reference clock frequency divided by the first divisor, wherein division by the first divisor causes the frequency divider to transition through a first predetermined state sequence; second means, responsive to a second state of the control signals, for using the reference clock signal to generate an output signal having a frequency that is the reference clock frequency divided by the second divisor, wherein division by the second divisor causes the frequency divider to transition through a second predetermined state sequence; third means, responsive to a third state of the control signals, for initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals; means for receiving a swallow enable control signal; means for disabling the second means whenever the swallow control signal is not set to a predetermined value; and means for generating an output control signal having the predetermined value whenever the frequency divider is in the initial state. In the serially-connected plurality of frequency dividers, a frequency divider of rank i supplies an $i^{th}$ output signal to a frequency divider of rank (i+1) for use as the reference clock signal in the frequency divider of rank (i+1), and the frequency divider of rank i supplies an $i^{th}$ output control signal to a frequency divider of rank (i−1) for use as the swallow enable control signal in the frequency divider of rank (i−1).

In another aspect of the invention, the multi-divide frequency divider further comprises one or more serially-connected second frequency divider units for supplying an input reference clock signal to the plurality of serially-connected frequency divider units, wherein each of the second frequency divider units lacks the third means for initializing the frequency divider to the initial state.

In yet another aspect of the invention, in each of the dividers of the multi-divide frequency divider, the first and second means are deactivated so long as the third state of the control signals continues to be received by the receiving means.

In still another aspect of the invention, the first divisor is two and the second divisor is three.

BRIEF DESCRIPTION OF THE DRAWINGS

The objects and advantages of the invention will be understood by reading the following detailed description in conjunction with the drawings in which.

DETAILED DESCRIPTION

Figure 1:
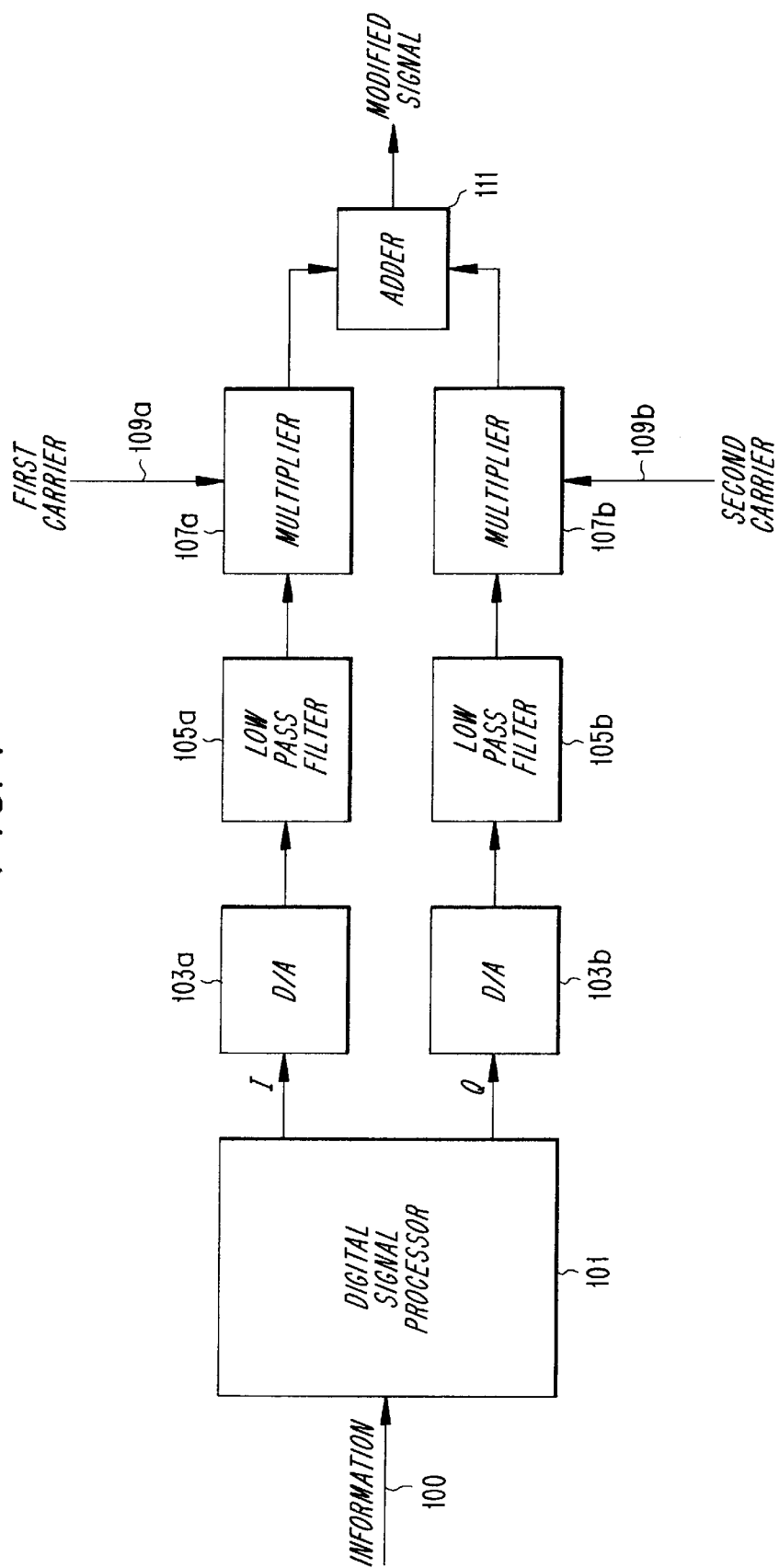
FIG. 1 is a block diagram of a conventional implementation of a continuous phase modulator.

The various features of the invention will now be described with respect to the figures, in which like parts are identified with the same reference characters.

In accordance with one aspect of the invention, a frequency divider is disclosed that is capable of responding to changes of the division factor once every reference frequency cycle, that introduces exactly equal delay for all division factors, and that is capable of dividing by a wide range of consecutive division factors. In another aspect of the invention, the frequency divider is applied for use in a $\Sigma\Delta$ controlled fractional-N modulator, giving the modulator multi-band functionality.

The invention will be described with respect to an exemplary embodiment that is capable of dividing a radio frequency by any of the integers within the range of 16–95. When applied in a $\Sigma\Delta$-controlled fractional-N PLL modulator along with a fitting reference frequency, $f_{ref}$, a range of output frequencies can be produced that will be suitable for the major cellular communication systems, such as GSM, AMPS, DECT, DCS, PCS and ACES. However, it will be recognized by those having ordinary skill in the art that the invention is not limited to the particular embodiment disclosed here. In particular, the inventive techniques may be applied to produce frequency dividers capable of dividing by integers within a range other than the exemplary range of 16–95. Furthermore, other embodiments of the inventive frequency divider may be applied in $\Sigma\Delta$-controlled fractional-N PLL modulators for use in communication systems other than the ones listed above. Furthermore, the inventive frequency divider may be applied for uses other than in a $\Sigma\Delta$-controlled fractional-N PLL modulator. Thus, the various embodiments described herein should be considered exemplary, and not limiting of the scope of the invention.

Figure 2:
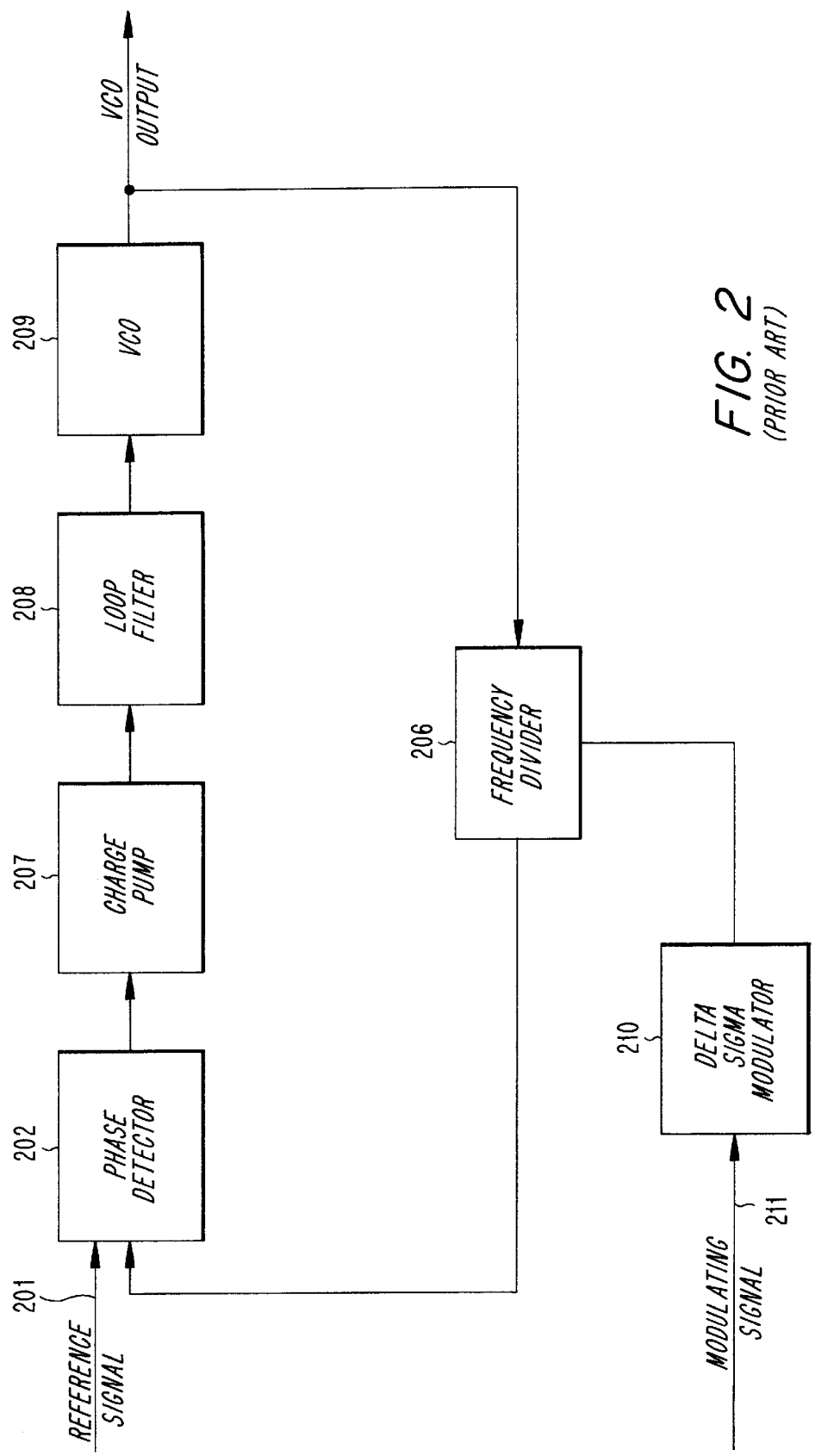
FIG. 2 is a block diagram of a conventional $\Delta\Sigma$ controlled fractional-N PLL modulator.

A block diagram of an exemplary embodiment of the inventive frequency divider will now be described with reference to FIG. 3. The actual frequency division is performed by a number of series-connected divider blocks. In accordance with one aspect of the invention, two types of divider blocks are utilized. A first type is any one of the conventional ⅔-divider blocks 300*a*, 300*b*, 300*c*, 300*d* (henceforth referred to generally by the reference number 300). This type of divider block is shown in greater detail in FIG. 4. A ⅔-divider block 300 divides the differential clock input frequency, i_clkX and i_clkbX, by 2 or 3, depending on the logical values of a first input control signal, i_sw$_x$ 401a and of a second input control signal, i_pgm$_x$ 307. (Of course, differential clock inputs are not required; an alternative would be to accept a single clock input, and to supply such an input to an inverter to generate an out-of-phase clock signal for use by the ⅔-divider block 300.) When configured in series with other ⅔-divider blocks 300, the i_sw$_x$ signal 401a is generally supplied by a more significant neighboring ⅔ divider block 300. When used in a continuous phase modulator, such as the one depicted in FIG. 2, the first input control signal, i_pgm$_x$ 307, is generally derived from the output of the ΣΔ modulator. The first input control signal, i_pgm$_x$ 307 is used to indicate whether division by two (i_pgm$_x$=0) or by three (i_pgm$_x$=1) is requested. However, in order for division by three to be performed, the second control signal, i_sw$_x$ 401a must also be set to one. In this sense, the i_sw$_x$ 401a may be considered a "swallow enable" signal (division by three in the ⅔-divider block 300 is performed by "swallowing" an extra clock cycle in addition to those normally swallowed for division by two). The pair of latches 402a and 402b work in a master-slave configuration, as do the pair of latches 403a and 403b. The output signal 404 (which may also be used as an i_sw$_{X+1}$ input signal 401a for a lesser significant neighboring ⅔ divider block) is supplied by the output of the latch 402a.

Figure 5:
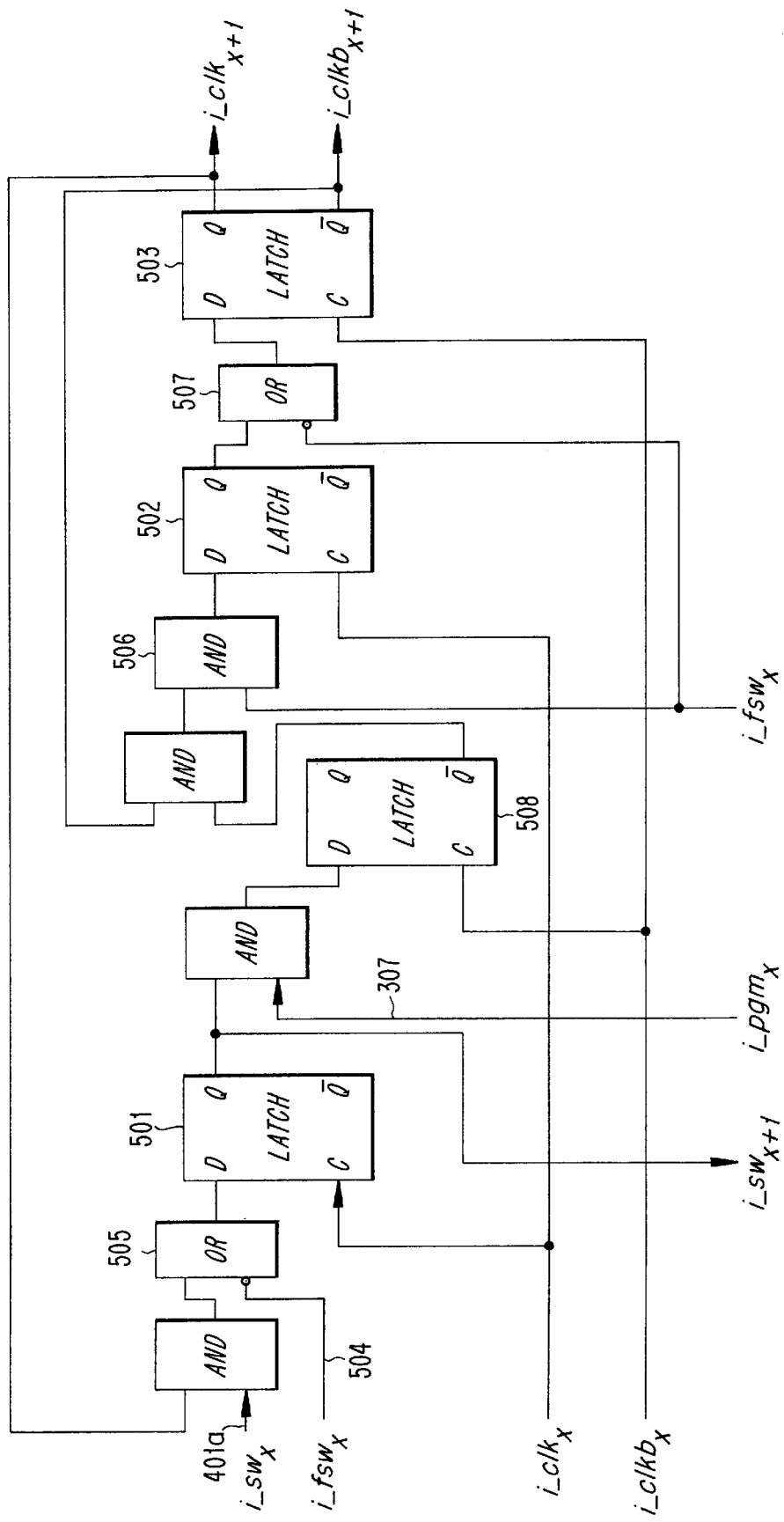
FIG. 5 is a block diagram of a presettable frequency divider unit in accordance with one aspect of the invention.

In accordance with one aspect of the invention, the multi-divide frequency divider further includes a second type of divider block, herein referred to as a presettable divider block 301. The presettable divider block 301 is shown in greater detail in FIG. 5. In the exemplary multi-divide frequency divider of FIG. 3, two presettable divider blocks 301a and 301b, are utilized in the most significant positions of the divider block chain (where the chain comprises both presettable and conventional divider blocks, 301 and 300). The presettable divider block 301 includes the same functionality as the conventional ⅔-divider block 300, and in addition, includes the ability to preset the outputs of its latches 501, 502 and 503. This preset option is provided by means of the AND gate 506 and OR gates 505, 507 disposed ahead of the latch inputs, as illustrated in FIG. 5. Control of the preset option is by means of the i_fsw$_x$ signal 308, coordinated with the i_pgm$_x$ signal 307.

This preset capability is very important for the complete implementation of the multi-divide frequency divider, because it provides an opportunity to switch the ⅔-divider block, which works like a state machine, on and off into the correct initial state. By doing this, one is able to increase and decrease the possible division factor range of the complete frequency divider at any time during operation. That is, the frequency divider will immediately (within the correct reference cycle) start to divide by the new division factor regardless of whether the wanted division factor is present in the decreased or expanded region. As used here, the term "decreased region" refers to those division factors that are obtainable when none of the presettable divider blocks 301 is enabled. In the exemplary embodiment, the decreased region would be division factors in the range from 16 to 31. As used here, the term "expanded region" refers to those division factors that are obtainable when one or more of the presettable divider blocks 301 is enabled in a divider block chain. In the exemplary embodiment, the expanded region would be division factors in the range from 32 to 63 (when only a first of the presettable divider blocks 301 is active) and from 64 to 95 (when both of the presettable divider blocks 301 is active).

The possible states and state transitions associated with one of the presettable divider blocks 301 will now be described with reference to the state transition diagram of FIG. 6. The presettable divider block 301 operates as a state machine, whose states are defined by the outputs of the four latches 501, 508, 502 and 503. In the following discussion, the state variable is defined by the four bit value designated QA, Q*B, QC, QD, where QA is the non-inverted output of the first latch 501, QB is the inverted output of the second latch 508, QC is the non-inverted output of the third latch 502, and QD is the non-inverted output of the fourth latch 503. The state diagram has three different loops, here called A, B and C. The state of the control signals i_fsw$_X$ 504, i_pgm$_X$ 307 and i_sw$_X$ 401a determines which of the loops is active.

Loop A is the set of transitions that the presettable divider block 301 undergoes when it divides the input clock signal by three. Loop A is active when i_fsw$_X$="1", i_pgm$_X$="1", and i_sw$_X$=1. Despite the fact that six states are utilized, division by three is accomplished because half of the latches 501 and 502 are clocked by the clock input signal, i_clk$_X$, and the other two latches 508 and 503 are clocked by the inverted clock input signal, i_clkb$_X$, so that, effectively, a state transition is made on the leading as well as the trailing edges of the input clock signal.

Loops B and C are each a set of transitions that the presettable divider block 301 undergoes when it divides the input clock signal by two. Loop B is active when i_fsw$_X$="1" and i_sw$_X$=0. The state of the control signal i_pgm$_X$ does not matter in this case. Loop C is active when i_fsw$_X$="1", i_pgm$_X$="0", and i_sw$_X$=1. Despite the fact that four states are utilized in each of the loops B and C, division by two is accomplished because a state transition is made on the leading as well as the trailing edges of the input clock signal, as explained above with respect to loop A.

Figure 3:
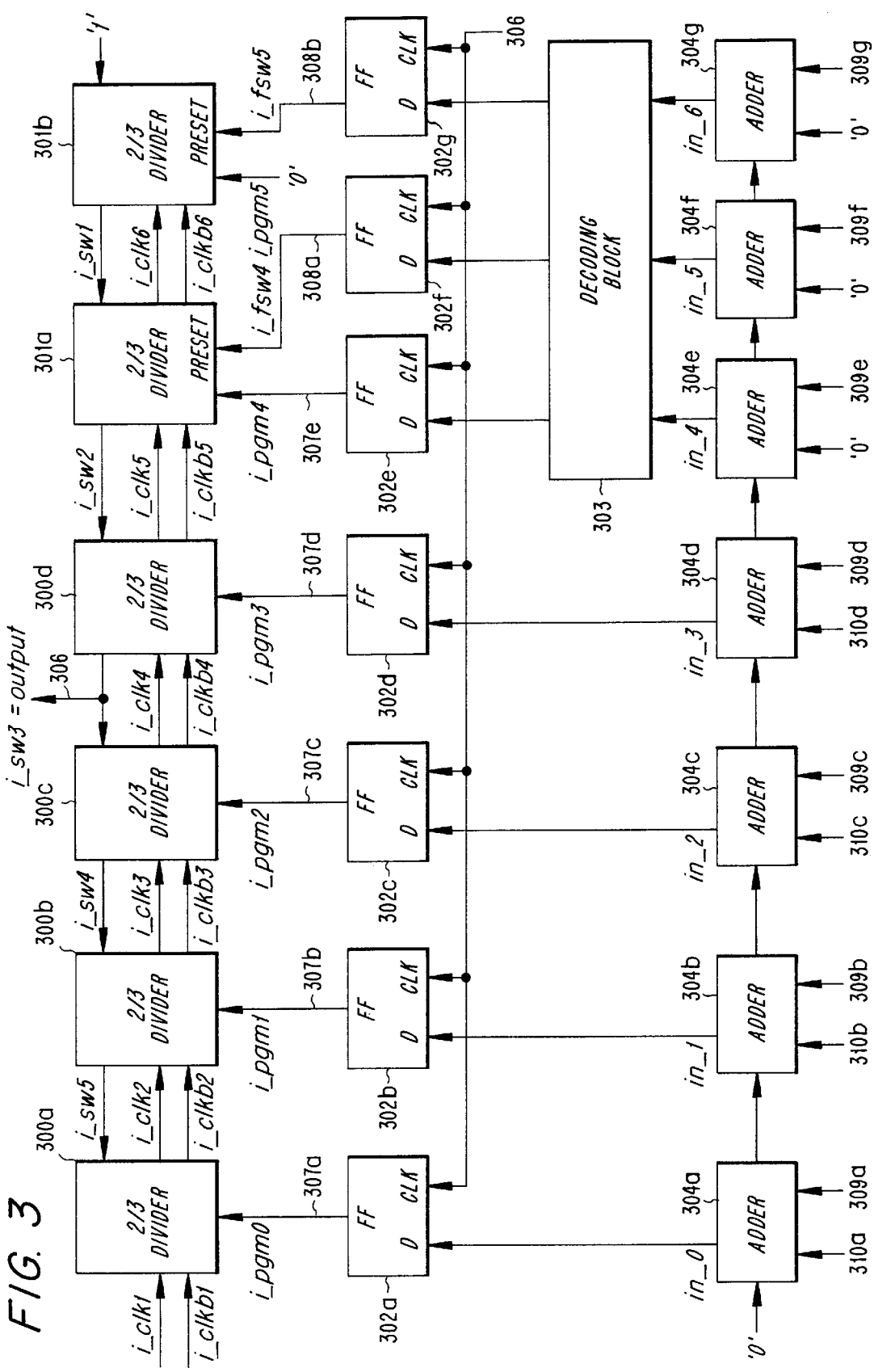
FIG. 3 is a block diagram of an exemplary embodiment of a multi-divide frequency divider in accordance with one aspect of the invention.
Figure 4:
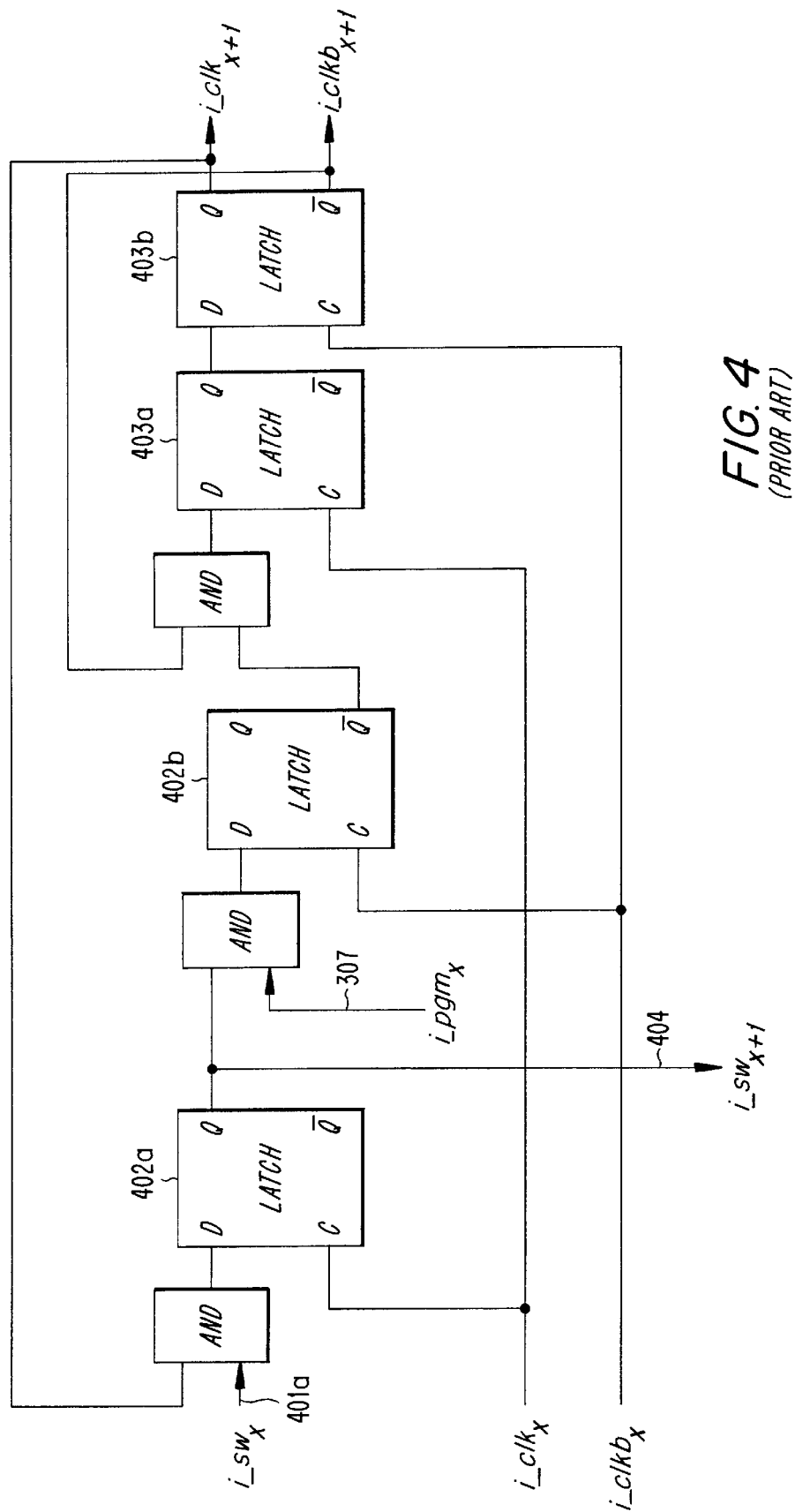
FIG. 4 is a block diagram of a conventional frequency divider unit.

Transitions from one loop to another are made as indicated in the diagram. Also, note that in each of the loops (A, B and C), the control signal i_fsw$_X$ is equal to "1". Whenever this signal is set equal to "0", the presettable divider block 301 enters the state "1101", and remains there until i_fsw$_X$ changes to a value of "0". When designing a presettable divider block 301, two conditions should be considered with respect to the initial state:

1) When used in a multi-divide frequency divider such as the one depicted in FIG. 3, the initial state should produce a logic "1" at QA because this signal must be applied to the i_sw input of a preceding active block in the ⅔ divider chain. Without this, the remaining divider blocks will not operate correctly.

2) The same initial state must be present in both the divide by 3 loop and at least one of the divide by 2 loops, in order to be able to calculate with the correct division factor when the block is activated.

Figure 6:
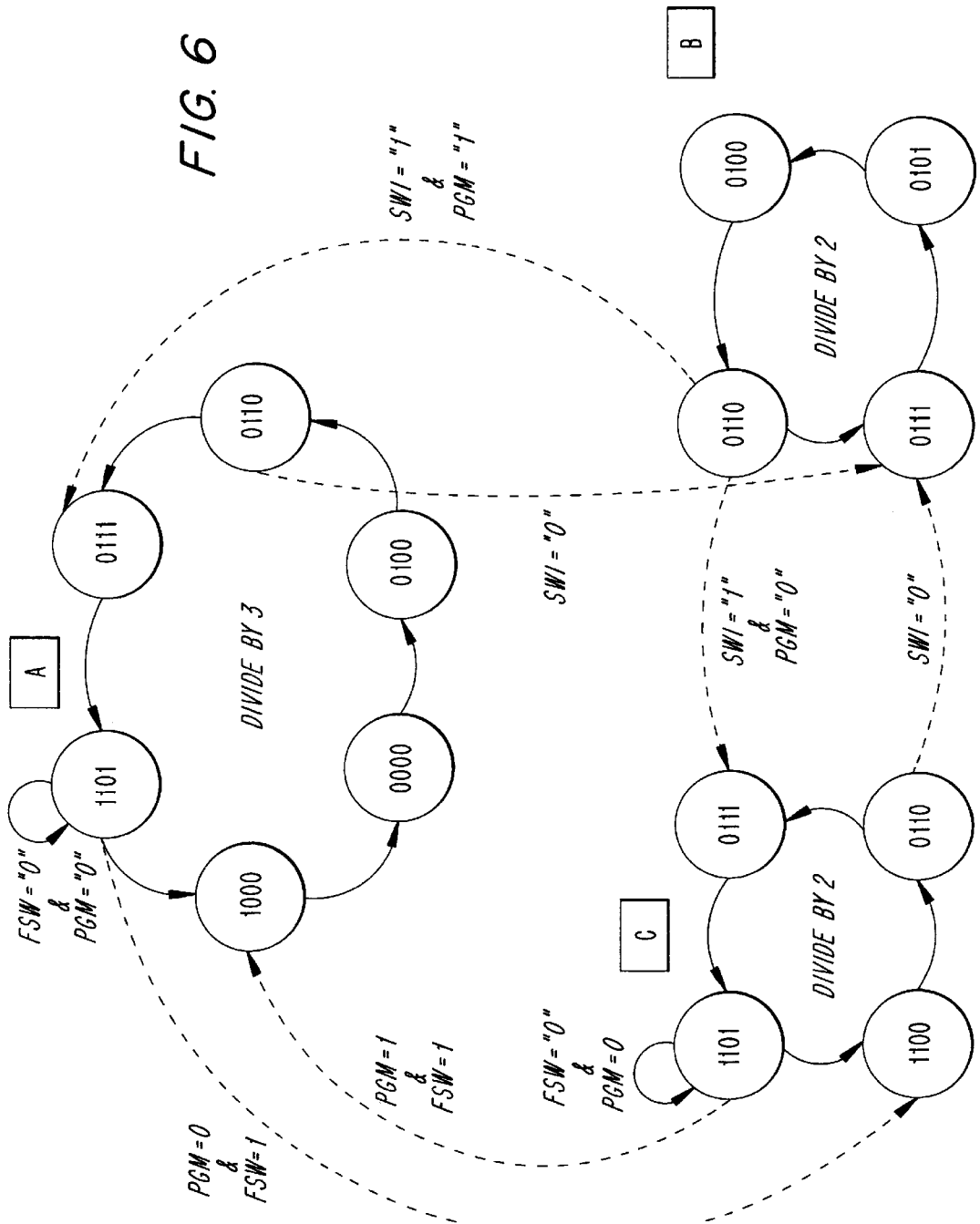
FIG. 6 is a state transition diagram associated with an exemplary presettable frequency divider unit in accordance with one aspect of the invention.

In the exemplary embodiment, whose state transitions are depicted in FIG. 6, there is only one state that fulfills both of these requirements, and that is the state "1101". This is the state that has been set by the logic gates 505, 506 AND 507 (see FIG. 5) whenever the control signals i_fsw$_X$ 504 and i_pgm$_X$ and 307 are deactivated (i.e., set to "0").

It will further be observed that in the state diagram of FIG. 6, transitions between loops A and B, which depend on changing the value of the i_pgm signal, are performed only from a particular state in each loop. In each of the exemplary loops A and B depicted in FIG. 6, these transitions are made from state "1101". This constraint is accomplished by using one of the i_sw signals in the chain (e.g., the i_sw3 signal 306) as the clock signal for switching the next division factor (i.e., the i_pgm signals) into the inputs of the ⅔ divider block chain. In general, selection of an i_sw$_x$ signal for this purpose should take into account that any divider block that will, at some point, be deactivated (such as the presettable divider blocks 301 in FIG. 3) cannot serve as the source for such a signal.

Referring back now to FIG. 3, the exemplary multi-divide frequency divider contains four conventional ⅔ divider blocks 300, two presettable ⅔-divider blocks 301, seven D flip-flops 302a–302g, a decoding block 303, and seven full adders 304a–304g. The seven D flip-flops 302a–302g store the next division factor that is to be used during the next reference frequency cycle. The D flip-flops 302a–302g are clocked by the rising edge of the output signal 306 of the multi-divide frequency divider. This makes it possible to apply the next division factor at the input of the D flip-flops 302a–302g without disturbing the calculation of the current division factor, and also ensures that the next division factor is loaded sufficiently fast to avoid the skipping of clock cycles in the ⅔-divider chain.

The seven full adders 304a–304g are connected in cascade to form a ripple carry adder. The purpose of the ripple carry adder is to add an offset value 309a–309g (7-bits wide in the exemplary embodiment) to modulation signals 310a–310d (4-bits wide in the exemplary embodiment). In a continuous phase modulator, such as the one depicted in FIG. 2, the modulation signals 310a–310d would be supplied by the ΣΔ modulator 210.

The outputs of the ripple carry adder cannot be applied directly to the divider block chain because they fail to take into account the need for preset control signals (i_sw$_x$ 308). In the exemplary embodiment, the control signals 308a and 308b that are supplied to the presettable divider blocks 301a and 301b control whether the preset capability of these blocks is enabled. When these signals are set to a logic "0", the presettable divider blocks 301a and 301b are switched off and the multi-divide frequency divider operates with only the four conventional ⅔ divider blocks 300a–300d. In this mode, the multi-divide frequency divider is capable of dividing the input frequency by a division factor between 16 and 31 (i.e., division factors ranging from $2^4$ to $2^4+2^4-1$).

In order to extend the division factor range, the presettable divider blocks 301a and 301b are switched on by applying a logic "1" to the i_sw$_x$ control signals (308a and 308b in FIG. 3). In this exemplary embodiment, it is possible to achieve division factors up to 95 by enabling both of the presettable divider blocks 301a and 301b. When the i_sw$_x$ control signals are enabled (i.e., switched to a logic "1"), the multi-divide frequency divider immediately begins dividing by the division factor in the extended region within the next reference clock cycle. This is possible because of the presetting of the ⅔ divider blocks into an initial state (as defined by the latches 501, 502, 503 and 508) that: 1) is common to both the divide by two and divide by three state sequences, and 2) causes the i_sw$_{x+1}$ signal to be an appropriate value to be supplied to a predecessor divider block in the divider chain. In the exemplary embodiment, the initial state of "1101" satisfies both of these requirements: it is common to both the divide by two and divide by three state sequences, and is causes the i_sw$_{x+1}$ signal to take on a value of logical "1".

In order to generate proper control signals that correspond to the various division factors specified at the outputs of the adders 304a–304g, a decoding block 303 is provided in accordance with another aspect of the invention. The decoding block 303 converts the binary representation of the division factor into proper control signals to be applied at the input of the presettable divider blocks 301a and 301b. In particular, the control signals in the exemplary embodiment generate a divisor, D, for the multi-divide frequency divider in accordance with the following equation:

$$D = i\_fsw5*2^5 + (i\_fsw4 \& i\_pgm4)*2^4 + i\_fsw4*2^4 + i\_pgm3*2^3 + i\_pgm2*2^2 + i\_pgm1*2^1 + i\_pgm0*2^0 = i\_fsw5*32 + (i\_fsw4 \& i\_pgm4)*16 + i_{fsw}4*16 + i\_pgm3*8 + i\_pgm2*4 + i\_pgm1*2 + i\_pgm0*1 \quad (1)$$

It will be observed that the Equation (1) does not include a term corresponding to the i_pgm5 signal. The reason for this is that, in the exemplary embodiment, this signal is always set equal to a binary zero. In other embodiments, however, this may not be the case, so the equation for the divisor, D, might include an i_pgm5 term.

It will also be observed that i_pgm4 adds a value of sixteen to the divisor only if the i_fsw4 term is also set equal to a binary one. Otherwise, the value of i_pgm4 does not have nay effect at all because the corresponding presettable divider is not active.

It is evident from Equation (1) that if all control signals are set to zero, then the multi-divide frequency divider divides by sixteen. This is because only the first four conventional ⅔ divider blocs 300 are active, and are set to divide by two (i.e., four cascaded dividers, each dividing by two, results in a division by $2^*2^*2^*2=16$). This means that in the exemplary embodiment, the minimum division factor is sixteen.

It is further evident from Equation (1) that the maximum possible divisor is activated when all of the control signals are set equal to one. In the exemplary embodiment, the maximum divisor $D_{max}=16+1+2+4+8+16+16+32=95$.

It is apparent that because two of the control signals (i.e., i_fsw4 and i_fsw5) each control the addition of the value "16" to the divisor, the binary representation is destroyed. Thus, it is the purpose of the decoding block 303 to take the three most significant bits (in_6, in_5 and in_4) of the binary representation of the divisor, and to convert them into the necessary control signals (i_fsw5, i_fsw4 and i_pgm4) for appropriately controlling the two presettable divider blocks 301. In the exemplary embodiment, the decoding block 303 maps the input signals in_7, in_6 and in_5 onto the control signals i_fsw5, i_pgm4 and i_fsw4 in accordance with the following equations:

i_fsw4=in_4 OR in_5 OR in_6 i_pgm4=(in_5 AND NOT (in_4)) OR (in_6 AND NOT (in_4))

i_fsw5=(in_5 AND in_4) OR in_6.

Of course, the above equations are applicable to the exemplary embodiment fully described herein. One having ordinary skill in the art would be able to apply the principles illustrated here in readily designing a decoding block for use in a frequency divider chain having any number of presettable divider blocks.

Figure 7:
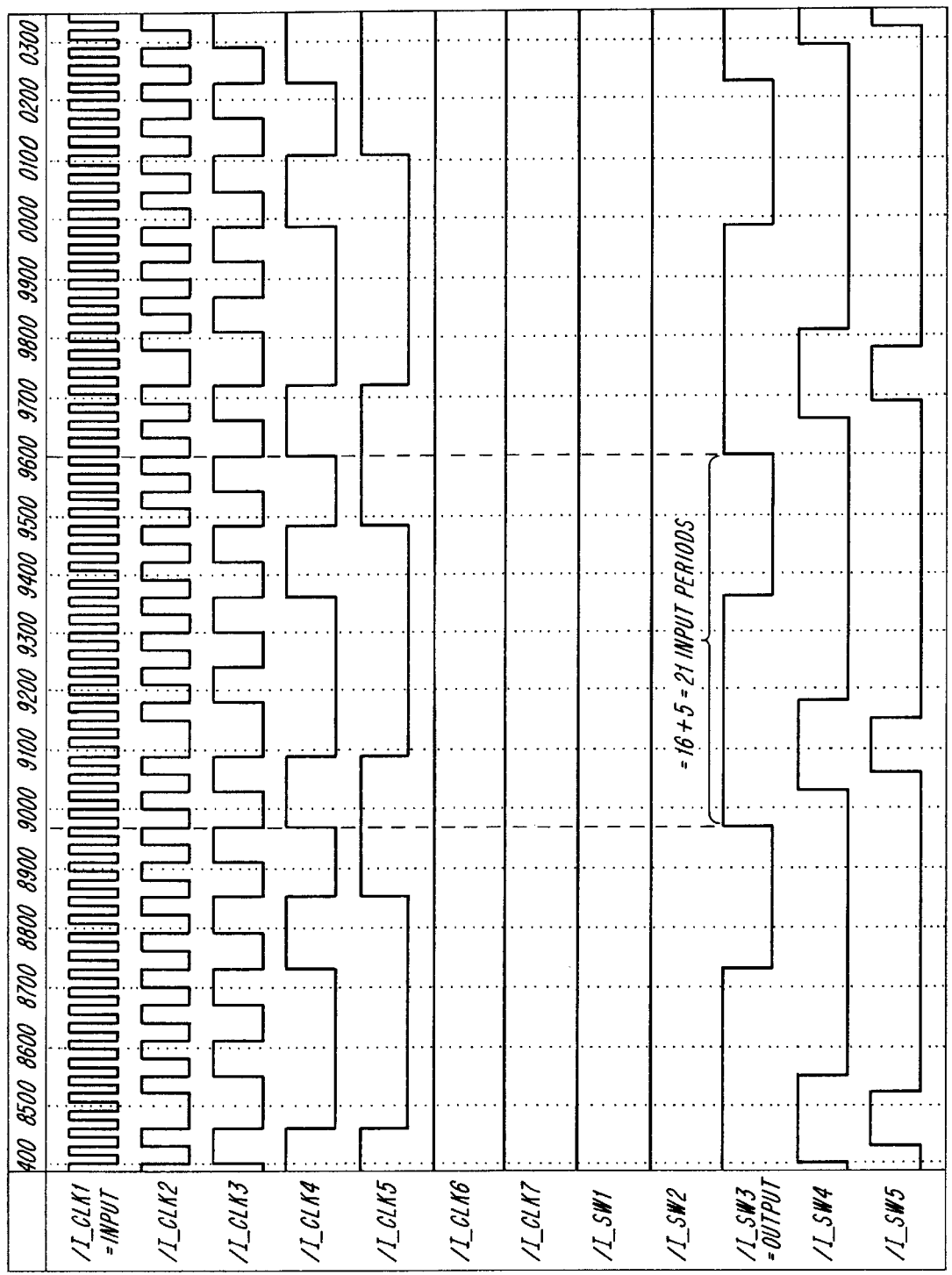
FIGS. 7–11 are timing diagrams depicting the pertinent signals within an exemplary divider block chain in accordance with one aspect of the invention.

The operation of the exemplary embodiment of the multi-divide frequency divider will now be further described with reference to FIGS. 7 through 11. Turning first to FIG. 7, this is the timing diagram depicting the pertinent signals within the divider block chain when the control signals, from least significant to most significant, are set as follows:

i_pgm0=1;

i_pgm1=0;

i_pgm2=1;

i_pgm3=0;

i_pgm4=0;

i_fsw4=0; and i_fsw5=0.

This control word (0000101) corresponds to a binary value of five. Because the exemplary multi-divide frequency divider always has an offset value of sixteen, this control word will cause frequency division by a factor of 16+5=21 to be accomplished. Note that in FIG. 7, all of the active i_sw signals have he same frequency but differ in duty cycle. The i_sw3 is preferably selected as the output of the multi-divide frequency divider because it has the most symmetrical duty cycle.

It will be further noted that the AND gate 506 and OR gates 505, 507 in each of the presettable divider blocks 301 together with the control signals i_fsw and i_pgm entering these blocks, ensures that the output "gating signal", that is i_sw1 and i_sw2, of the blocks is always set to a logical "1", thereby enabling the remaining preceding) active blocks to work correctly. If both of the presettable blocks are disabled, then the relevant output "gating signal" is i_sw2 (see FIG. 3). If only the most significant presettable block is disabled and the least significant presettable block is active, then the relevant output "gating signal" is i_sw1. Moreover, the AND gate 506 and OR gates 505, 507 in the presettable divider blocks 301, together with the control signals i_pgm and i_fsw entering these divider blocks 301, keep the presettable divider blocks 301 in an initial state for so long as these blocks are disabled (i_fsw4=i_fsw5="0"). Consequently, each presettable divider block 301 will be ready to immediately resume division by either two or by three whenever it is re-enabled.

Figure 8:
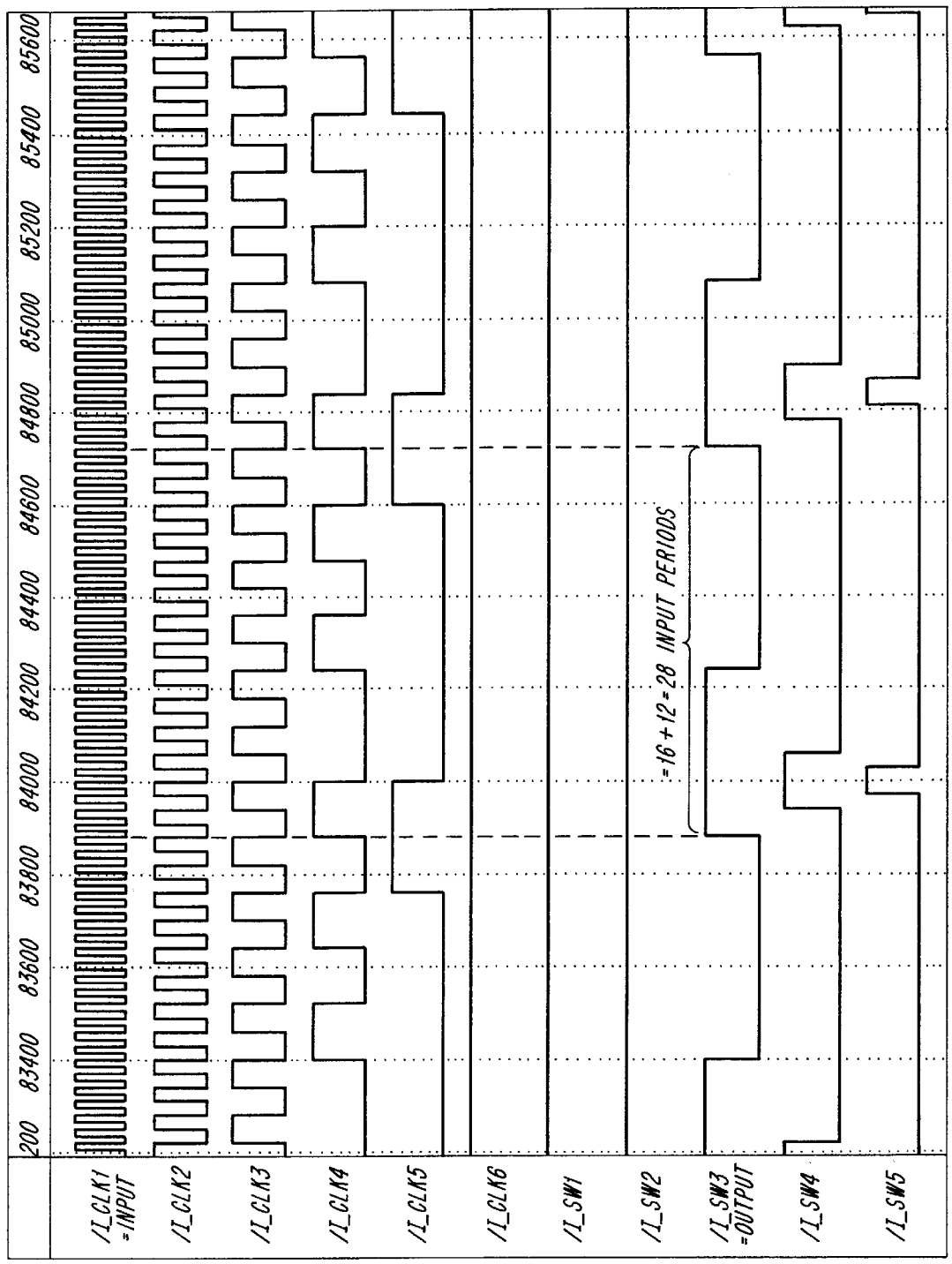

Referring now to FIG. 8, this is a timing diagram depicting the pertinent signals within the divider block chain when the control signals, from least significant to most significant, are set as follows:

i_pgm0=0;

i_pgm1=0;

i_pgm2=1;

i_pgm3=1;

i_pgm4=0;

i_fsw4=0; and i_fsw5=0.

This control word (0001100) corresponds to a binary value of twelve. Because the exemplary multi-divide frequency divider always has an offset value of sixteen, this control word will cause frequency division by a factor of 16+12=28 to be accomplished. In FIG. 8, this can be seen by comparing the number of cycles of the input frequency (i_clk1) with that of the output frequency (i_sw3).

Figure 9:
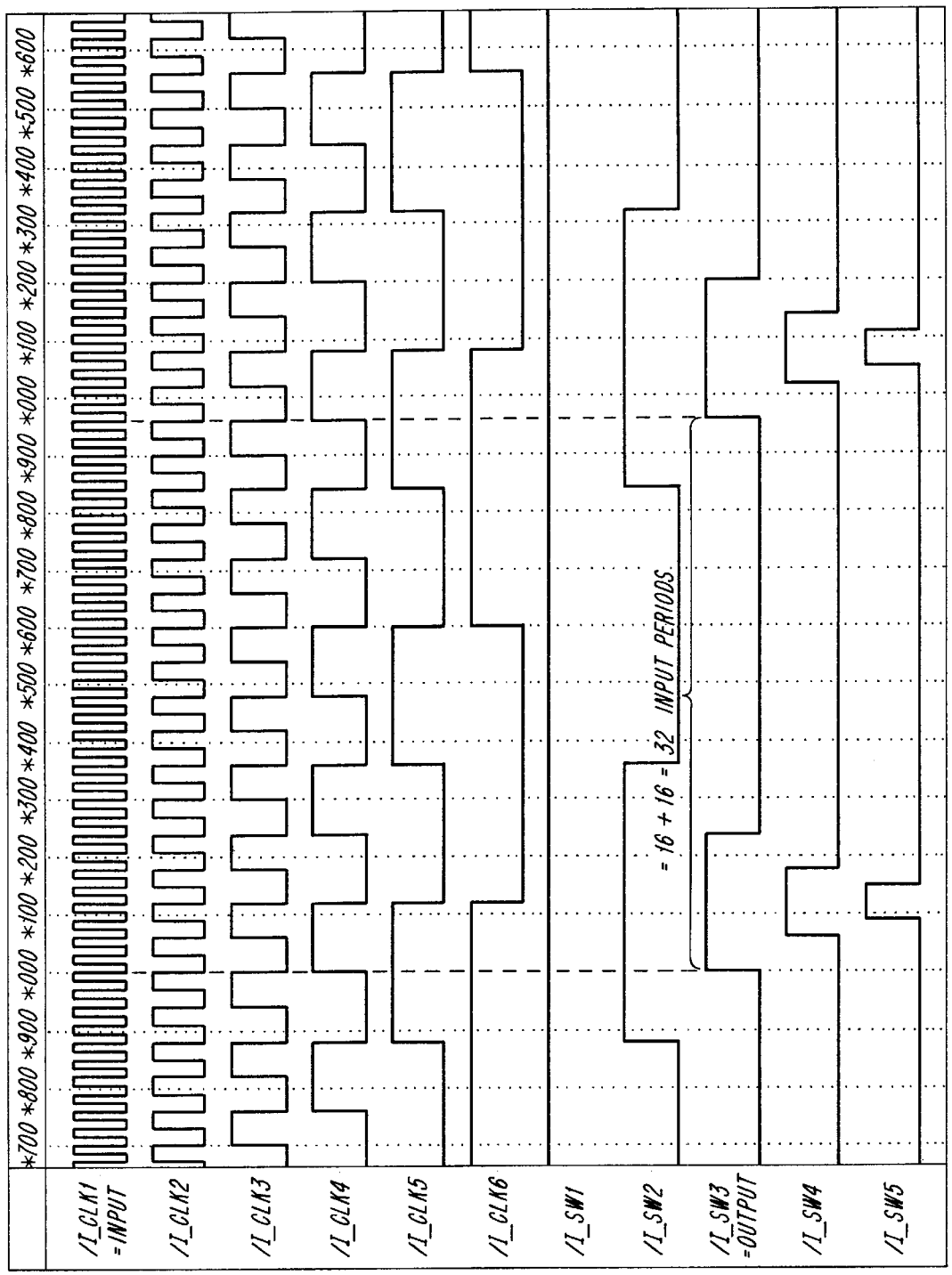

Referring now to FIG. 9, this is a timing diagram depicting the pertinent signals within the divider block chain when the control signals, from least significant to most significant, are set as follows:

i_pgm0=0;

i_pgm1=0;

i_pgm2=0;

i_pgm3=0;

i_pgm4=0;

i_fsw4=1; and i_fsw5=0.

This control word (0100000) corresponds to a binary value of sixteen. Because the exemplary multi-divide frequency divider always has an offset value of sixteen, this control word will cause frequency division by a factor of 16+16=32 to be accomplished. In FIG. 9, this can be seen by comparing the number of cycles of the input frequency (i_clk1) with that of the output frequency (i_sw3).

Figure 10:
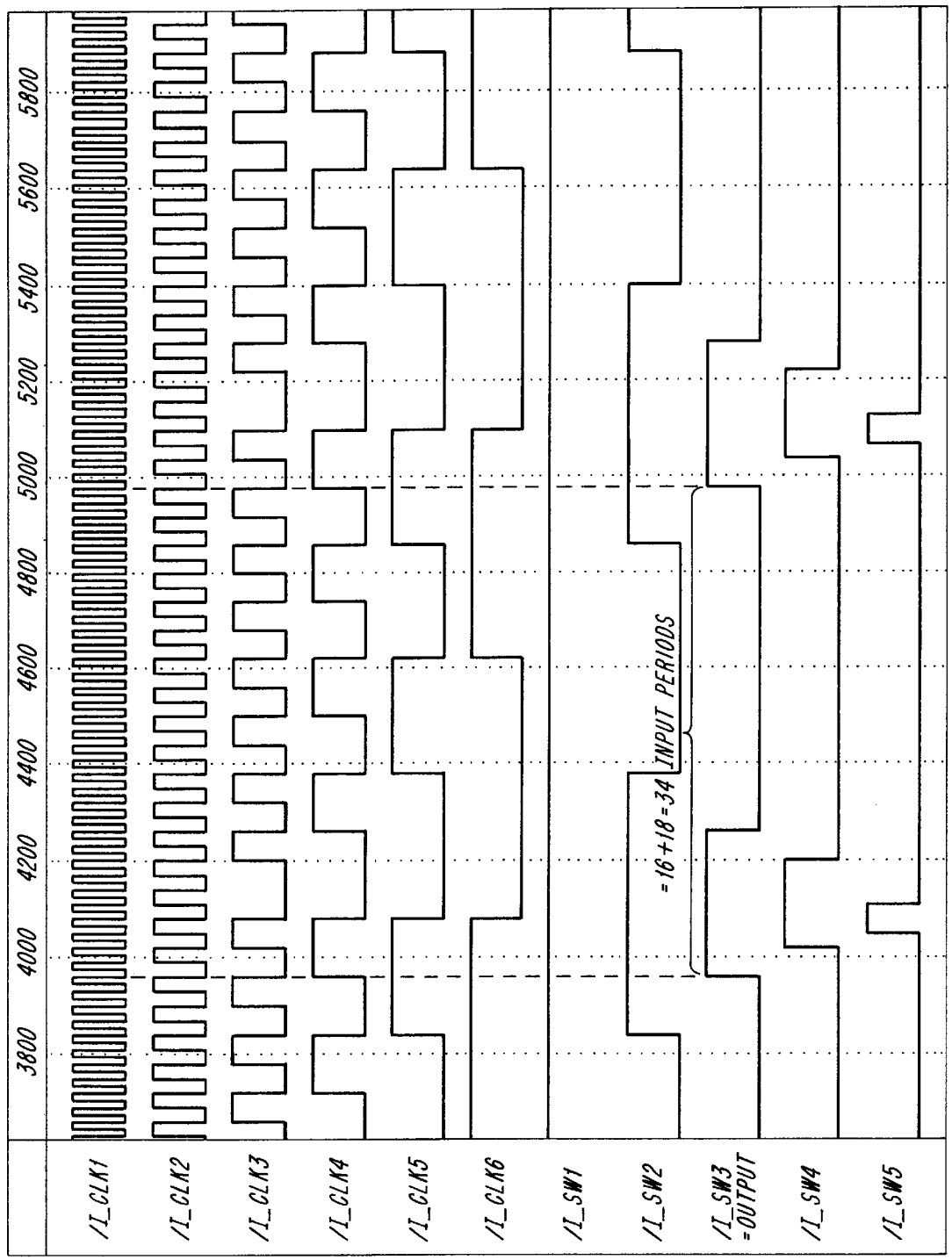

Referring now to FIG. 10, this is a timing diagram depicting the pertinent signals within the divider block chain when the control signals, from least significant to most significant, are set as follows:

i_pgm0=0;

i_pgm1=1;

i_pgm2=0;

i_pgm3=0;

i_pgm4=0;

i_fsw4=1; and i_fsw5=0.

This control word (0100010) corresponds to a binary value of eighteen. Because the exemplary multi-divide frequency divider always has an offset value of sixteen, this control word will cause frequency division by a factor of 16+18=34 to be accomplished. In FIG. 10, this can be seen by comparing the number of cycles of the input frequency (i_clk1) with that of the output frequency (i_sw3).

Figure 11:
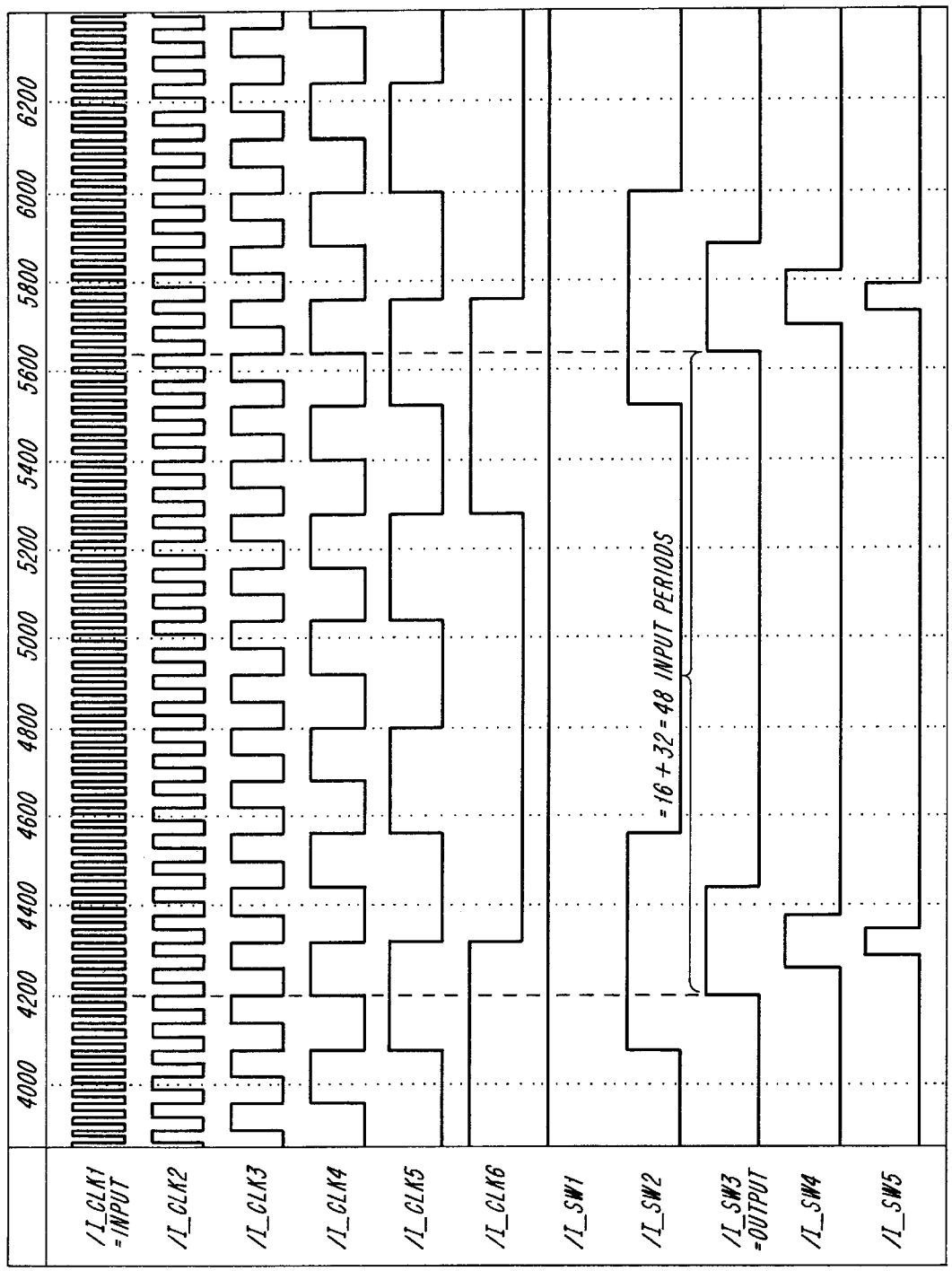

Referring now to FIG. 11, this is a timing diagram depicting the pertinent signals within the divider block chain when the control signals, from least significant to most significant, are set as follows:

i_pgm0=0;

i_pgm1=0;

i_pgm2=0;

i_pgm3=0;

i_pgm4=1;

i_fsw4=1; and i_fsw5=0.

This control word (0110000) corresponds to a binary value of 32 (i.e., 16+16). Because the exemplary multi-divide frequency divider always has an offset value of sixteen, this control word will cause frequency division by a factor of 16+32=48 to be accomplished. In FIG. 11, this can be seen by comparing the number of cycles of the input frequency (i_clk1) with that of the output frequency (i_sw3).

Figure 12:
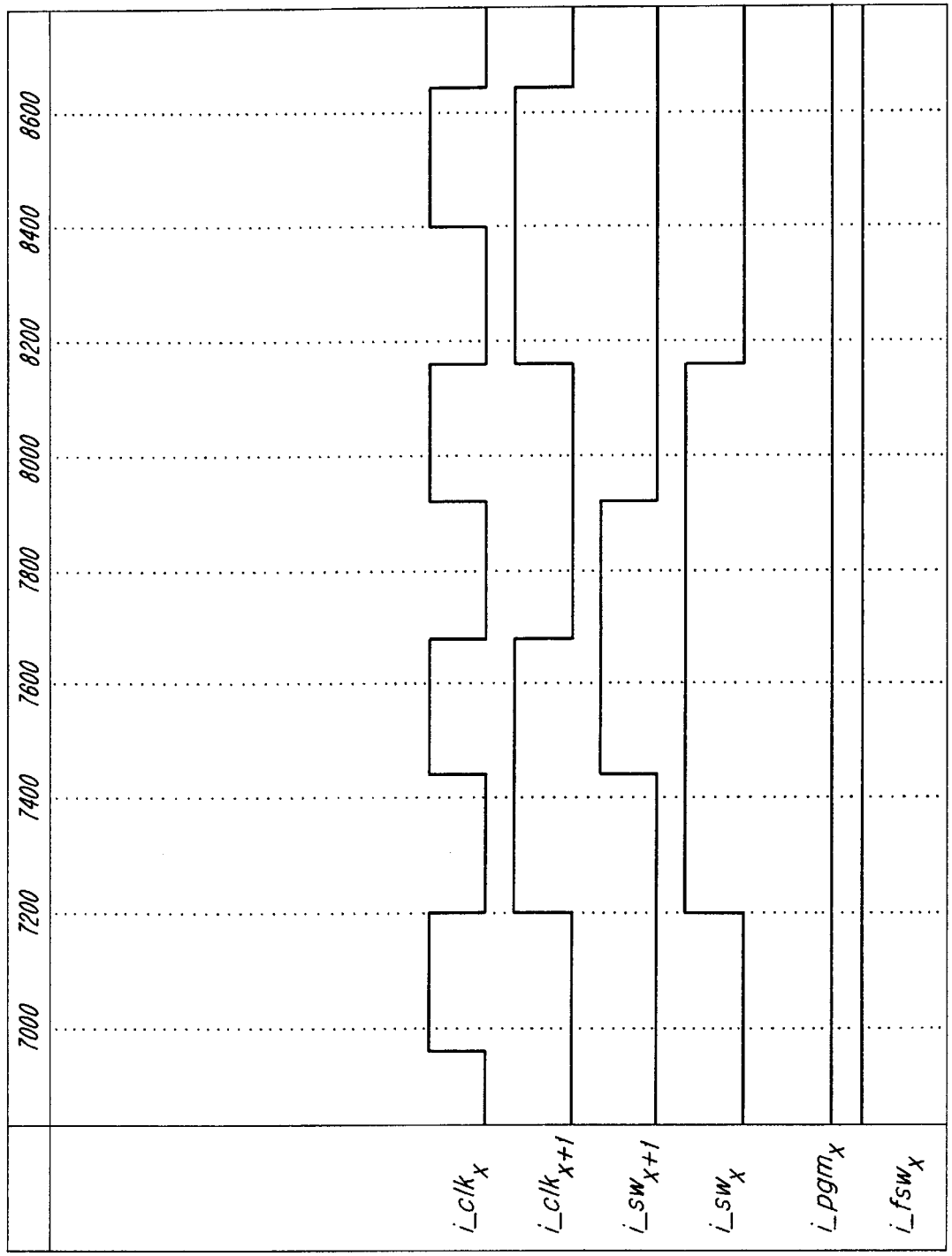
FIGS. 12 and 13 are timing diagrams depicting the signals within an exemplary one of the presettable divider blocks in accordance with one aspect of the invention.
Figure 13:
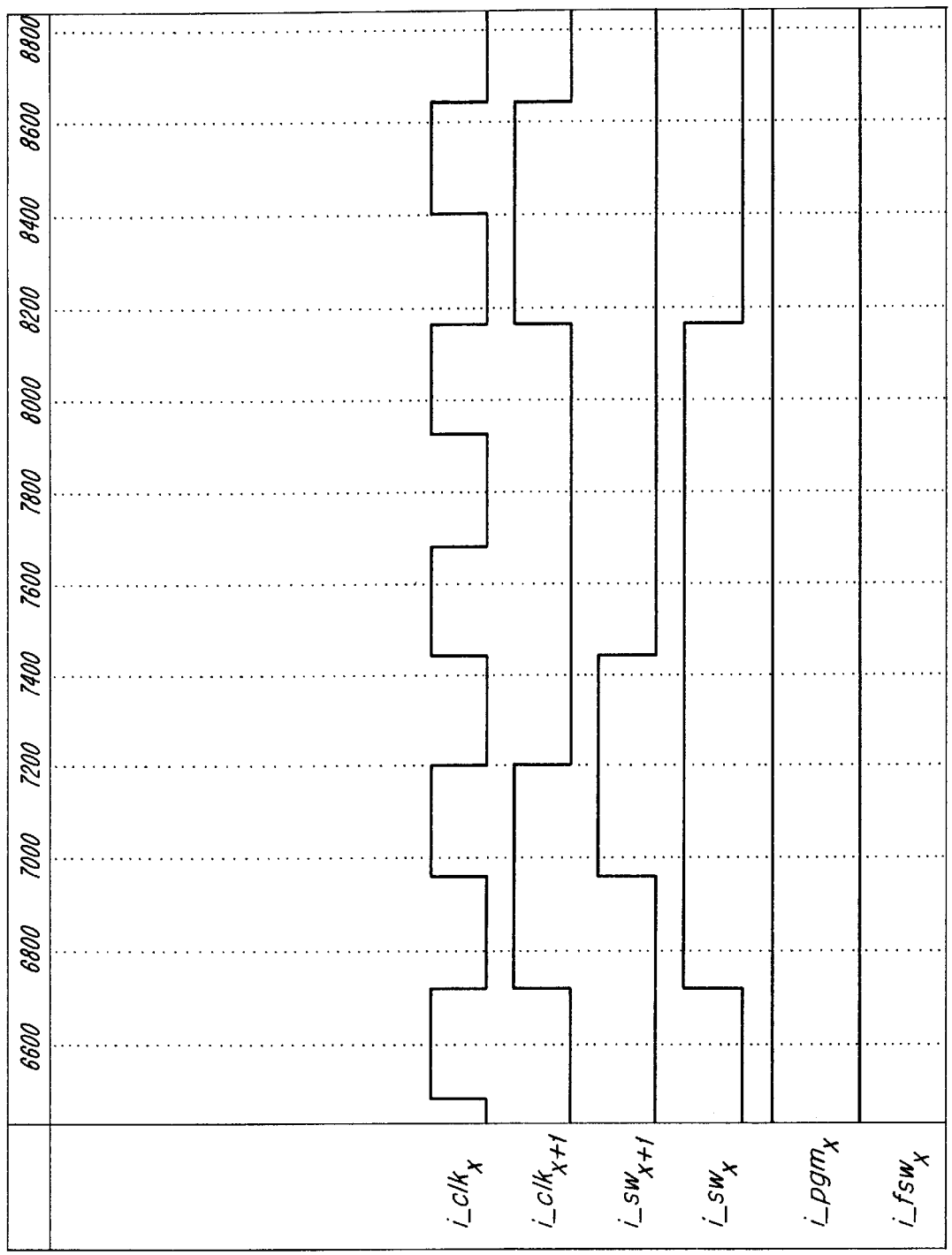

To complete the picture, FIGS. 12 and 13 are timing diagrams depicting the signals within a single one of the presettable divider blocks 301. In each case, operation of the presettable divider block 301 is enabled (i_fsw$_X$=1). In FIG. 12, the i_pgm$_X$ signal is inactive (e.g.,="0") when the swallow enable signal, i_sw$_X$ is asserted, so the presettable divider block 301 divides by two. This can be seen by comparing the periods of the i_clk$_X$ and i_clk$_{X+1}$ signals. By contrast, in FIG. 13, the i_pgm$_X$ signal is active (e.g.,="1") when the swallow enable signal, i_sw$_X$ is asserted, so the presettable divider block 301 divides by three. Again, this can be seen by comparing the periods of the i_clk$_X$ and i_clk$_{X+1}$ signals.

Now that exemplary timing diagrams for different control signal settings have been described, the discussion will focus on explaining how the input control signals i_sw and i_pgm work within the presettable divider blocks 301. The presettable divider blocks 301 are capable of dividing the input clock signal by two or by three, depending on the value of signals applied at the two control inputs of the block, referred to as the "programming input", i_pgm, and the "enable swallow input", i_sw. For a given division factor, appropriate signals are permanently applied to the programming inputs (i_pgm), whereas an enable signal received on another control input of each block (i_sw) determines the instant at which the relevant block must perform the "pulse swallow", that is, the division by three. (The pulse swallow is, of course, only performed if the programming input, i_pgm, is set to an active logical state.) Each presettable divider block 301 receiving an "enable swallow signal" supplies the preceding block in the chain with a signal that can be called a "gating signal". This signal is received by the preceding block as an "enable swallow signal."

One must keep in mind that during one output clock cycle from the total frequency divider, only one of the input clock cycles entering a ⅔-divider block is allowed to be swallowed, and that is controlled by the "gating signal" (i_sw) originating from the more significant block in the chain.

If one examines one of the timing diagrams, it can be seen that the duration of the "gating signal" coming out of a divider block is exactly one input clock cycle of that block. For example, FIG. 9 shows the signal i_sw3 having a duration of one period of i_clk4, which is the input clock signal of that block. It will be observed that this fact is also true for all of the corresponding $i\_sw_X$ and $i\_clk_X$ signals shown in FIG. 9 (i.e., i_sw5 and i_clk2; i_sw4 and i_clk3; i_sw3 and i_clk4; and i_sw2 and i_clk5). If one then examines the illustrated i_sw1 and i_clk6 signals, it can be seen that i_clk6 has one period exactly equal to the relevant output period ((i_sw3). Applying the rule that the duration of the "gating signal" out from a block should be equal the period of the incoming clock signal, this means that the signal i_sw1 should be high all of the time. Essentially, this means that the most significant active block produces the wanted output frequency, which implies that this block only has one opportunity per output cycle to swallow a pulse (i.e., divide by three), meaning that its "swallow enable" signal should be high for the complete output cycle. The output of the most significant active block then repeats itself and thereby implies that "swallow enable" should always be high.

To accomplish a constant high "swallow enable" signal in the most significant active divider block in the chain of divider blocks, the i_fsw signal is introduced (where "fsw" stands for "fixed swallow enable"). The i_fsw signal together with the three extra logical gates (i.e., OR gate 505 and AND gates 506 and 507) and the i_pgm signal accomplishes a fixed output "gating signal" to the preceding most significant active block and at the same time "locks" the inactive divider block into the correct initial state.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A frequency divider that is selectively capable of dividing by first and second divisors greater than one, the frequency divider comprising:
    means for receiving a reference clock signal having a reference clock frequency;
    means for receiving a plurality of control signals;
    first means, responsive to a first state of the control signals, for using the reference clock signal to generate an output signal having a frequency that is the reference clock frequency divided by the first divisor, wherein division by the first divisor causes the frequency divider to transition through a first predetermined state sequence;
    second means, responsive to a second state of the control signals, for using the reference clock signal to generate an output signal having a frequency that is the reference clock frequency divided by the second divisor, wherein division by the second divisor causes the frequency divider to transition through a second predetermined state sequence; and
    third means, responsive to a third state of the control signals, for initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals.

2. The frequency divider of claim 1, wherein the first and second means are deactivated so long as the third state of the control signals continues to be received by the receiving means.

3. The frequency divider of claim 1, further comprising:
    means for receiving a swallow enable control signal;
    means for disabling the second means whenever the swallow enable control signal is not set to a predetermined value; and
    means for generating an output control signal having the predetermined value whenever the frequency divider is in the initial state.

4. The frequency divider of claim 1, wherein the first divisor is two and the second divisor is three.

5. A multi-divide frequency divider, comprising:
    a plurality of serially-connected frequency divider units, each comprising:
        means for receiving a reference clock signal having a reference clock frequency;
        means for receiving a plurality of control signals;
        first means, responsive to a first state of the control signals, for using the reference clock signal to generate an output signal having a frequency that is the reference clock frequency divided by the first divisor, wherein division by the first divisor causes the frequency divider to transition through a first predetermined state sequence;
        second means, responsive to a second state of the control signals, for using the reference clock signal to generate an output signal having a frequency that is the reference clock frequency divided by the second divisor, wherein division by the second divisor causes the frequency divider to transition through a second predetermined state sequence;
        third means, responsive to a third state of the control signals, for initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals;
        means for receiving a swallow enable control signal;
        means for disabling the second means whenever the swallow control signal is not set to a predetermined value; and means for generating an output control signal having the predetermined value whenever the frequency divider is in the initial state, wherein a frequency divider of rank i in the serially-connected plurality of frequency dividers supplies an $i^{th}$ output signal to a frequency divider of rank (i+1) for use as the reference clock signal in the frequency divider of rank (i+1), and the frequency divider of rank i supplies an $i^{th}$ output control signal to a frequency divider of rank (i-1) for use as the swallow enable control signal in the frequency divider of rank (i-1).

6. The multi-divide frequency divider of claim 5, further comprising one or more serially-connected second frequency divider units for supplying an input reference clock signal to the plurality of serially-connected frequency divider units, wherein each of the second frequency divider units lacks the third means for initializing the frequency divider to the initial state.

7. The multi-divide frequency divider of claim 5, wherein in each of the dividers, the first and second means are deactivated so long as the third state of the control signals continues to be received by the receiving means.

8. The multi-divide frequency divider of claim 5, wherein the first divisor is two and the second divisor is three.

9. A method of controlling a frequency divider to selectively perform frequency division by first and second divisors greater than one, the method comprising the steps of:

receiving a reference clock signal having a reference clock frequency;

receiving a plurality of control signals;

responding to a first state of the control signals by using the reference clock signal to generate an output signal having a frequency that is the reference clock frequency divided by the first divisor, wherein division by the first divisor includes the steps of transitioning through a first predetermined state sequence;

responding to a second state of the control signals by using the reference clock signal to generate an output signal having a frequency that is the reference clock frequency divided by the second divisor, wherein division by the second divisor includes transitioning through a second predetermined state sequence; and responding to a third state of the control signals by initializing the frequency divider to an initial state that is common to both the first and second predetermined state sequences, whereby the frequency divider in the initial state is immediately responsive to subsequent application of the first state of the control signals, and is immediately responsive to subsequent application of the second state of the control signals.

10. The method of claim 9, wherein neither of the steps of responding to the first and second states of the control signals is performed so long as the third state of the control signals continues to be received by the receiving means.

11. The method of claim 9, further comprising the steps of:

receiving a swallow enable control signal;

inhibiting the step of responding to a second state of the control signals whenever the swallow enable control signal is not set to a predetermined value; and generating an output control signal having the predetermined value whenever the frequency divider is in the initial state.

12. The method of claim 9, wherein the first divisor is two and the second divisor is three.

* * * * *